US012492473B2

(12) United States Patent
Seo

(10) Patent No.: US 12,492,473 B2
(45) Date of Patent: Dec. 9, 2025

(54) ROLL TO ROLL ATOMIC LAYER DEPOSITION APPARATUS

(71) Applicant: BEILab corp., Ansan-si (KR)

(72) Inventor: Jihyun Seo, Suwon-si (KR)

(73) Assignee: BEILab corp., Ansan-si (KR)

( * ) Notice: Subject to any disclaimer, the term of this patent is extended or adjusted under 35 U.S.C. 154(b) by 197 days.

(21) Appl. No.: 18/328,843

(22) Filed: Jun. 5, 2023

(65) Prior Publication Data

US 2023/0304153 A1 Sep. 28, 2023

Related U.S. Application Data

(63) Continuation of application No. 17/507,383, filed on Oct. 21, 2021, now abandoned.

(30) Foreign Application Priority Data

Oct. 29, 2020 (KR) ........................ 10-2020-0141699

(51) Int. Cl.
*C23C 16/455* (2006.01)
*C23C 16/54* (2006.01)

(52) U.S. Cl.
CPC .. *C23C 16/45551* (2013.01); *C23C 16/45595* (2013.01); *C23C 16/545* (2013.01)

(58) Field of Classification Search
None
See application file for complete search history.

(56) References Cited

U.S. PATENT DOCUMENTS 4,466,258 A 8/1984 Sando et al.
8,304,019 B1 * 11/2012 Pichler .............. C23C 16/45502 427/248.1
2007/0224348 A1 * 9/2007 Dickey ............. C23C 16/45551 118/718
2013/0236641 A1 * 9/2013 Aizenberg ........ C23C 16/45534 427/255.6
2018/0274101 A1 * 9/2018 Kano ................ C23C 16/45527
2018/0291506 A1 * 10/2018 Sanderson .............. C23C 16/54
2020/0165724 A1 * 5/2020 Park ......................... C23C 16/54
2022/0131125 A1 * 4/2022 Yushin .................... C23C 16/30

FOREIGN PATENT DOCUMENTS

KR 10-2015-0030400 A 3/2015

* cited by examiner

*Primary Examiner* — Karla A Moore
(74) *Attorney, Agent, or Firm* — NKL LAW; Jae Youn Kim

(57) ABSTRACT

Proposed is a roll to roll atomic layer deposition method, which deposits an atomic layer on a porous material, the roll to roll atomic layer deposition method including: moving, by a pair of winding rollers, reciprocatingly the porous material in a longitudinal direction; supplying, by one or more source substance suppliers, a source substance to the porous material while the porous material is moving reciprocatingly in the longitudinal direction; and sucking, by one or more pumps, the source substance supplied from the one or more source substance suppliers.

6 Claims, 4 Drawing Sheets

ROLL TO ROLL ATOMIC LAYER DEPOSITION APPARATUS

CROSS-REFERENCE TO RELATED APPLICATIONS

This application is a continuation of U.S. patent application Ser. No. 17/507,383 filed on Oct. 21, 2021 which claims the priority of Korean Patent Application No. 10-2020-0141699 filed on Oct. 29, 2020, in the Korean Intellectual Property Office, the disclosure of which is incorporated herein by reference.

BACKGROUND

Field

The present disclosure relates to a roll to roll atomic layer deposition apparatus, and more particularly, to a roll to roll atomic layer deposition apparatus capable of depositing an atomic layer on a porous material under a normal-pressure environment without a vacuum chamber.

In general, an atomic layer deposition apparatus is used to deposit an atomic layer on a wafer (or substrate).

A roll to roll atomic layer deposition apparatus in the related art supplies a source substance to a processing target in a state in which the processing target is accommodated in a reaction chamber in which a vacuum state is maintained.

That is, the roll to roll atomic layer deposition apparatus in the related art essentially has a large-scale vacuum chamber for performing an atomic layer deposition process on the processing target.

The roll to roll atomic layer deposition apparatus in the related art requires space and costs for installing the large-scale vacuum chamber.

In addition, the roll to roll atomic layer deposition apparatus in the related art supplies the source substance (e.g., precursor) to the processing target in the form of a pulse. Meanwhile, in case of sequentially supplying different source substances, a purge process may be essentially required between a process of supplying one source substance and a process of supplying another source substance.

The roll to roll atomic layer deposition apparatus in the related art may increase the time required for the atomic layer deposition process.

For example, Korean Patent Application Laid-Open No. 10-2015-0030400 discloses a roll to roll atomic layer deposition apparatus in the related art.

SUMMARY

An object of the present disclosure is to provide a roll to roll atomic layer deposition method capable of performing an atomic layer deposition process on a processing target under a normal-pressure environment without requiring a vacuum chamber.

Another object of the present disclosure is to provide a roll to roll atomic layer deposition method capable of reducing costs required for a vacuum chamber and reducing manufacturing costs for the entire method.

Still another object of the present disclosure is to provide a roll to roll atomic layer deposition method capable of reducing the time required to perform an atomic layer deposition process on a processing target by supplying a source substance to the processing target with a continuous supply method (i.e., a consistent supply method) instead of a pulsed supply method.

Yet another object of the present disclosure is to provide a roll to roll atomic layer deposition method capable of reducing the time required for an atomic layer deposition process because a purge process is not separately needed between a process of supplying one source substance and a process of supplying another source substance.

According to an aspect of the present disclosure, there is provided a roll to roll atomic layer deposition method, which deposits an atomic layer on a porous material, the roll to roll atomic layer deposition method including: moving, by a pair of winding rollers, reciprocatingly the porous material in a longitudinal direction; supplying, by one or more source substance suppliers, a source substance to the porous material while the porous material is moving reciprocatingly in the longitudinal direction; and sucking, by one or more pumps, the source substance supplied from the one or more source substance suppliers. According to an exemplary embodiment: the pair of winding rollers is disposed to be spaced apart from each other and winds two opposite side portions of a porous material in the longitudinal direction, the one or more source substance suppliers disposed between the pair of winding rollers; the one or more pumps are disposed to correspond to the one or more source substance suppliers in a one-to-one manner; the one or more source substance suppliers, the porous material and the one or more pumps are arranged without a vacuum chamber; the one or more source substance suppliers and the one or more pumps are disposed, respectively, to face one another with the porous material interposed therebetween, such that the source substance supplied from the one or more source substance suppliers is introduced directly into the one or more pumps after passing through the porous material, no inert gas is utilized for the source substance to be introduced directly into the one or more pumps after passing through the porous material, and a suction port of one of the one or more pumps is disposed to face a supply port disposed at an end of one of the one or more source substance suppliers, and a diameter of the suction port is larger than a diameter of the supply port.

According to the present disclosure, since the pump corresponds to the source substance supply unit, the deposition (i.e., coating) of the atomic layer on the porous material may be smoothly performed without a configuration such as a vacuum chamber.

The one or more source substance supply units and the one or more pumps may be disposed to face one another with the porous material interposed therebetween. Therefore, the source substance supplied from the source substance supply unit may be introduced and discharged into the pump immediately after the source substance passes through the porous material.

A suction port of the pump may be disposed to face a supply port disposed at an end of the source substance supply unit. Further, a diameter of the suction port may be larger than a diameter of the supply port.

Therefore, the source substance supplied from the source substance supply unit may be more efficiently and more assuredly introduced and discharged into the pump after passing through the porous material.

According to the embodiment of the present disclosure, the source substance supply unit may be provided in plural, the pump may be provided in plural, and the supply ports of the plurality of source substance supply units and the suction ports of the plurality of pumps may correspond to one another in a one-to-one manner.

This is to smoothly and quickly perform the coating process on the porous material without a configuration such as a chamber or a separate process such as a purge process.

The roll to roll atomic layer deposition method may further include a control unit configured to control the pair of winding rollers, the source substance supply unit, and the pump, and during a process of depositing an atomic layer on the porous material, the control unit may control the pair of winding rollers to reciprocatingly move the porous material by a preset distance in the longitudinal direction between the pair of winding rollers, and the control unit may control the source substance supply unit and the pump to be continuously operated.

Therefore, since the source substance is continuously supplied instead of a pulsed manner, the coating thickness may be determined depending on the number of reciprocating movements of the porous material. In other words, the coating thickness on the porous material may be determined depending on the number of reciprocating movements of the porous material.

According to the present disclosure, it is possible to provide the roll to roll atomic layer deposition method capable of performing the atomic layer deposition process on the processing target under the normal-pressure environment without requiring a vacuum chamber.

That is, according to the present disclosure, it is possible to provide the roll to roll atomic layer deposition method capable of reducing costs required for a vacuum chamber and reducing manufacturing costs for the entire method.

In addition, according to the present disclosure, it is possible to provide the roll to roll atomic layer deposition method capable of reducing the time required to perform the atomic layer deposition process on the processing target by supplying the source substance to the processing target with the continuous supply method (i.e., the consistent supply method) instead of a pulsed supply method.

In addition, according to the present disclosure, it is possible to provide the roll to roll atomic layer deposition method capable of reducing the time required for the atomic layer deposition process because a purge process is not separately needed between a process of supplying one source substance and a process of supplying another source substance.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Figure 1:
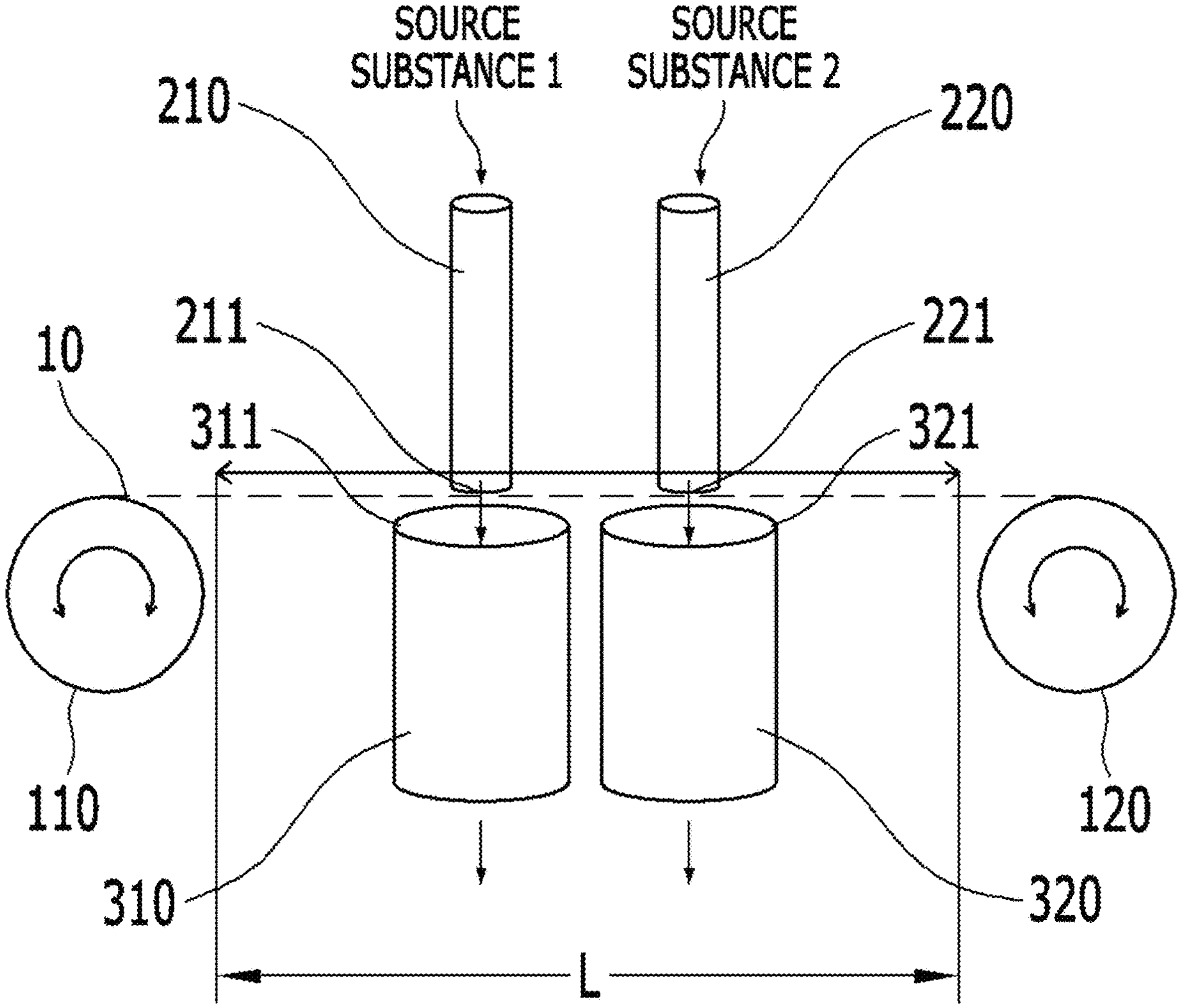
FIG. 1 is a conceptual view illustrating a roll to roll atomic layer deposition apparatus according to an embodiment of the present disclosure.

Hereinafter, a roll to roll atomic layer deposition method according to an embodiment of the present disclosure will be described below in detail with reference to the accompanying drawings. The accompanying drawings illustrate exemplary forms of the present disclosure and are provided merely to describe the present disclosure in more detail, and the drawings do not limit the technical scope of the present disclosure.

In addition, the same or similar constituent elements are assigned with the same reference numerals regardless of reference numerals, and the repetitive description thereof will be omitted. For the convenience of description, sizes and shapes of the respective illustrated constituent members may be exaggerated or reduced.

Meanwhile, the terms including ordinal numbers such as “first” and “second” may be used to describe various constituent elements, but the constituent elements should not be limited by the terms, and these terms are used only to distinguish one constituent element from another constituent element.

FIG. 1 is a conceptual view illustrating a roll to roll atomic layer deposition apparatus according to an embodiment of the present disclosure. To help understanding the present disclosure, in FIG. 1, a longitudinal direction (or a horizontal direction or a direction in which a processing target moves) is defined as an X-axis direction, and an upward/downward direction (or a height direction or a vertical direction) is defined as a Y-axis direction. For example, the Y-axis direction may mean a direction perpendicular to the X-axis direction.

In addition, deposition of an atomic layer on a processing target (porous material) may be expressed as coating of the processing target.

Referring to FIG. 1, the roll to roll atomic layer deposition apparatus according to the embodiment of the present disclosure may be configured (or controlled) to appropriately deposit an atomic layer on a porous material under a normal-pressure environment.

In this case, the normal-pressure environment may mean an environment in which a vacuum chamber is not separately required. For example, the normal-pressure environment may be an atmospheric pressure environment. In addition, examples of the porous material may include fiber, paper, metal, carbon, separators, webs, and the like having fine holes.

The roll to roll atomic layer deposition apparatus illustrated in FIG. 1 may include a pair of winding rollers 110 and 120 wound around a porous material 10, source substance supply units 210 and 220, and pumps 310 and 320.

The porous material 10 may be made of a soft material or a flexible material. The porous material 10 may be wound around the pair of winding rollers 110 and 120 and extended in a longitudinal direction thereof while having predetermined tension between the pair of winding rollers 110 and 120.

The pair of winding rollers 110 and 120 may be disposed to be spaced apart from each other. Two opposite side portions of the porous material 10 in the longitudinal direction may be wound around the pair of winding rollers 110 and 120. For example, the pair of winding rollers 110 and 120 may include a first winding roller 110 and a second winding roller 120. One side portion of the porous material 10 may be wound around the first winding roller 110, and the other side portion of the porous material 10 may be wound around the second winding roller 120.

The porous material 10 may extend in the horizontal direction between the first winding roller 110 and the second winding roller 120. That is, the porous material 10 may extend in the horizontal direction by a length corresponding to a distance between the first winding roller 110 and the second winding roller 120.

A control unit to be described below may control the pair of winding rollers 110 and 120 to rotate the pair of winding rollers 110 and 120 forward (e.g., clockwise) and reversely (e.g., counterclockwise).

When the right direction of the X-axis in FIG. 1 is defined as a forward direction, the porous material 10 may move in the forward direction as the pair of winding rollers 110 and 120 rotate forward. On the contrary, when the pair of winding rollers 110 and 120 rotate reversely, the porous material 10 may move in the reverse direction (i.e., a direction opposite to the forward direction).

To reciprocatingly move the porous material 10 in the forward direction and reverse direction, the pair of winding rollers 110 and 120 reciprocatingly rotate forward and reversely. That is, the pair of winding rollers 110 and 120 may reciprocatingly move the porous material 10 in the longitudinal direction.

For example, a reciprocating movement distance (i.e., a reciprocating movement length) of the porous material 10 in the longitudinal direction may be determined depending on forward and reverse rotation angles of the pair of winding rollers 110 and 120.

The porous material 10 may reciprocatingly move in the longitudinal direction in a state in which a source substance to be described below is supplied. Therefore, a thickness (i.e., a coating thickness) of the atomic layer deposited on the porous material 10 may be determined depending on the number of times the porous material 10 reciprocatingly moves in the longitudinal direction.

In general, the coating thickness is determined depending on the pulse number when the source substance is supplied in the form of a pulse. Alternatively, according to the present disclosure, because the source substance is supplied continuously (e.g., consistently), the coating thickness is determined depending on the number of times the porous material 10 reciprocatingly moves.

In the illustrated embodiment, in the state in which the source substance is continuously supplied, the porous material 10 may reciprocatingly move the number of times (determined depending on a target coating thickness) preset by a length indicated by "L".

In this case, the length "L" may mean a length of a part of the porous material 10 which is to be subjected to the processing. That is, in the illustrated embodiment, the porous material 10 may reciprocatingly move between a first position at which a left end of the "L" corresponds to a left end of the source substance supply units 210 and 220 to be described below and a second position at which a right end of the "L" corresponds to a right end of the source substance supply units 210 and 220.

When the number of times the porous material 10 reciprocatingly moves reaches a preset number of times, the porous material 10 moves in the forward direction (the right direction in the drawing) by the length "L" and is wound around the second winding roller 120. Thereafter, a non-processed part of the porous material 10 unwound from the first winding roller 110 may be coated by reciprocatingly moving the preset number of times by the length "L". Further, this coating process may be sequentially performed over an overall length of the porous material 10.

The source substance supply units 210 and 220 may supply the source substance (e.g., precursor) to the porous material 10. One or more source substance supply units 210 and 220 may be provided. When the plurality of source substance supply units 210 and 220 is provided, the respective source substance supply units may supply different source substances.

For example, the source substances are precursors and may be elements including Al, Ti, Hf, Zr, and the like on the periodic table. Further, the source substances are reactants (oxidants) and may include $H_2O$, $H_2O_2$, $O_2$, $O_3$, and the like.

The source substance supply units 210 and 220 may supply the source substances to the processing target length "L" of the porous material 10.

The source substance supply units 210 and 220 may be disposed between the pair of winding rollers 110 and 120. That is, the source substance supply units 210 and 220 may be disposed between the first winding roller 110 and the second winding roller 120.

Specifically, the source substance supply units 210 and 220 may be disposed above or below the porous material 10 extending in the horizontal direction between the pair of winding rollers 110 and 120. In the illustrated embodiment, the source substance supply units 210 and 220 are disposed above the porous material 10, but the present disclosure is not limited thereto.

For example, the source substance supply units 210 and 220 may include a first source substance supply unit 210 and a second source substance supply unit 220. The first source substance supply unit 210 and the second source substance supply unit 220 may be disposed to be spaced apart from each other in the horizontal direction at a preset distance.

The first position, which corresponds to the left end of the source substance supply units 210 and 220, may mean a left end of the first source substance supply unit 210. The second position, which corresponds to the right end of the source substance supply units 210 and 220, may mean a right end of the second source substance supply unit 220.

The first source substance supply unit 210 may supply a source substance 1, and the second source substance supply unit 220 may supply a source substance 2. In the illustrated embodiment, the source substance 1 and the source substance 2 are different from each other. However, the present disclosure does not exclude a case in which the source substance 1 and the source substance 2 are identical to each other.

The supply of source substances to the porous material 10 from the source substance supply units 210 and 220 may not be performed under a vacuum environment. That is, according to the present disclosure, the coating process may be performed on the porous material 10 without a configuration such as a vacuum chamber.

This is because the source substances supplied from the source substance supply units 210 and 220 may be introduced and discharged into the pumps 310 and 320 to be described below immediately after passing through the processing target part of the porous material 10. The supply of the source substances, the operation of allowing the source substances to pass through the processing target (the processing target part of the porous material), and the discharge of the source substances may be performed because the processing target is the porous material. In this case, the discharge of the source substances may mean that the source substances having passed through the processing target is discharged through a guide duct or the like to the outside of the space in which the roll to roll atomic layer deposition apparatus is installed.

That is, according to the present disclosure, the atomic layer deposition process (i.e., coating process) may be performed on the porous material 10 without a vacuum chamber, the deposition (i.e., coating) of the atomic layer may be more quickly and uniformly performed even on the surfaces of the fine holes formed in the porous material 10.

The pumps 310 and 320 may suck the source substances supplied from the source substance supply units 210 and 220. One or more pumps 310 and 320 may be provided, and the pumps 310 and 320 may correspond in number to the source substance supply units 210 and 220. That is, the one or more pumps 310 and 320 may be disposed to correspond to one or more source substance supply units 210 and 220.

For example, the pumps 310 and 320 may suck the source substances which are supplied to the processing target length "L" of the porous material 10 from the source substance supply units 210 and 220 and then pass through the porous material 10.

The pumps 310 and 320 may be disposed between the pair of winding rollers 110 and 120. That is, the pumps 310 and 320 may be disposed between the first winding roller 110 and the second winding roller 120.

Specifically, the pumps 310 and 320 may be disposed above or below the porous material 10 extending in the horizontal direction between the pair of winding rollers 110 and 120. In the illustrated embodiment, the pumps 310 and 320 are disposed below the porous material 10, but the present disclosure is not limited thereto.

For example, the pumps 310 and 320 may include a first pump 310 and a second pump 320. The first pump 310 and the second pump 320 may be disposed to be spaced apart from each other in the horizontal direction at a preset distance.

Further, the first pump 310 may be disposed to correspond to (face) the first source substance supply unit 210, and the second pump 320 may be disposed to correspond to (face) the second source substance supply unit 220.

That is, the source substance supply units 210 and 220 and the pumps 310 and 320 may be disposed to face one another with the porous material 10 interposed therebetween. More specifically, the source substance supply units 210 and 220 and the pumps 310 and 320 may be disposed to face one another in a direction perpendicular to the extension direction of the porous material 10.

Therefore, the source substances having passed through the porous material 10 may be immediately sucked and discharged through the pumps 310 and 320.

In addition, the pumps 310 and 320 and the source substance supply units 210 and 220 may be disposed to correspond to one another in a one-to-one manner so that the source substances supplied from the source substance supply units 210 and 220 may be discharged immediately after the source substances pass through the processing target part of the porous material 10.

To allow the pumps 310 and 320 to smoothly suck and discharge the source substances, suction ports 311 and 321 of the pumps 310 and 320 may be disposed to face supply ports 211 and 221 provided at ends (i.e., discharge ends) of the source substance supply units 210 and 220.

Specifically, transverse sections of the supply ports 211 and 221, transverse sections of the suction ports 311 and 321, and a surface of the processing target part of the porous material 10 may be disposed substantially in parallel.

More specifically, radial centers of the supply ports 211 and 221 and radial centers of the suction ports 311 may be positioned on the same line (e.g., an imaginary line). In this case, the imaginary line may extend in the direction perpendicular to the extension direction of the porous material 10.

In other words, the supply ports 211 and 221 and the suction ports 311 and 321 may be disposed such that the imaginary line, which connects the radial centers of the supply ports 211 and 221 and the radial centers of the suction ports 311 and 321, vertically penetrates the porous material 10.

In addition, to smoothly suck and discharge the source substances, a diameter of each of the suction ports 311 and 321 may be larger than a diameter of each of the supply ports 211 and 221. That is, an area of the transverse section of each of the supply ports 211 and 221 may completely overlap an area of the transverse section of each of the suction ports 311 and 321. For example, a radius of each of the suction ports 311 and 321 may be 1.2 to 3 times a radius of each of the supply ports 211 and 221.

Since the source substances supplied from the source substance supply units 210 and 220 are sucked and discharged into the pumps 310 and 320 immediately after the source substances pass through the porous material 10, the coating process may be smoothly performed on the porous material 10 without a vacuum chamber. In addition, the coating may be more quickly and uniformly formed even on the surfaces of the fine holes formed in the porous material 10.

Hereinafter, connection relationships between main components of the roll to roll atomic layer deposition apparatus according to the embodiment of the present disclosure and a method of controlling the roll to roll atomic layer deposition apparatus will be described with reference to another drawing.

Figure 2:
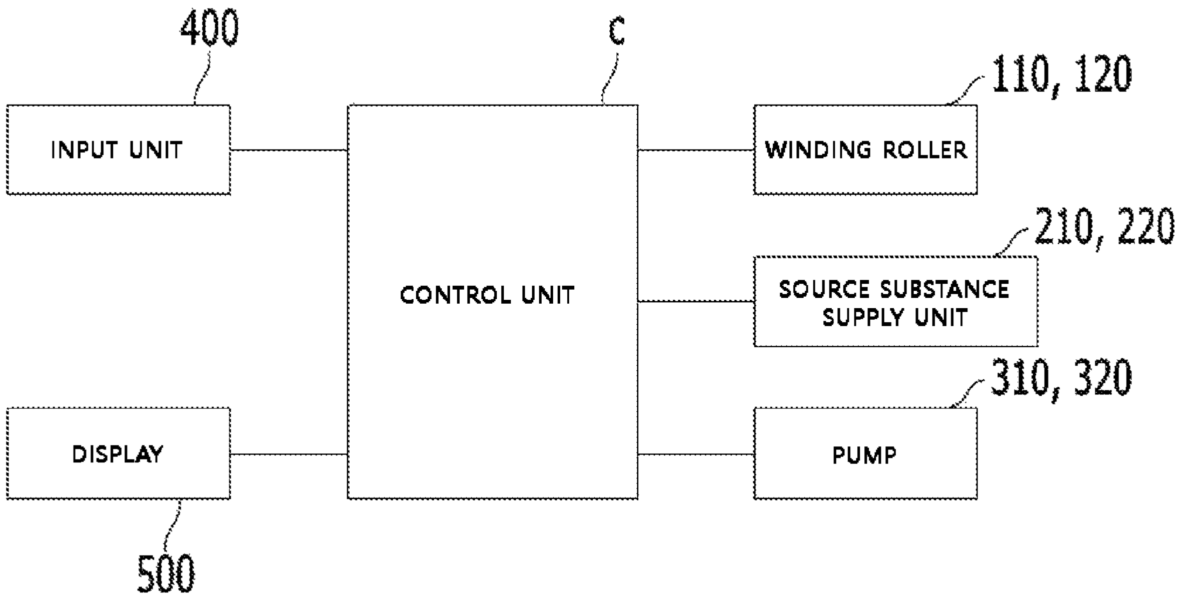
FIG. 2 is a view illustrating connection relationships between main components of the roll to roll atomic layer deposition apparatus according to the embodiment of the present disclosure.

FIG. 2 is a view illustrating the connection relationships between the main components of the roll to roll atomic layer deposition apparatus according to the embodiment of the present disclosure.

Referring to FIGS. 1 and 2, the roll to roll atomic layer deposition apparatus according to the embodiment of the present disclosure may further include a control unit C configured to control the winding rollers 110 and 120, the source substance supply units 210 and 220, and the pumps 310 and 320.

The control unit C is electrically connected to the winding rollers 110 and 120, the source substance supply units 210 and 220, and the pumps 310 and 320 and configured to transmit control signals and receive feedback in respect to operating states.

The roll to roll atomic layer deposition apparatus according to the embodiment of the present disclosure may further include an input unit 400 and a display 500 electrically connected to the control unit C.

A control instruction inputted through the input unit 400 may be transmitted by the control unit C to at least one of the winding rollers 110 and 120, the source substance supply units 210 and 220, and the pumps 310 and 320.

In addition, the display 500 may display the control instruction inputted through the input unit 400 and the operating state of the respective components received as feedback through the control unit C.

Meanwhile, the user may input information on a thickness of an atomic layer (i.e., a coating thickness) to be deposited on the porous material through the input unit 400. The control unit C may determine the number of reciprocating movements of the porous material depending on the inputted information and control the winding rollers 110 and 120 to repeatedly rotate the winding rollers 110 and 120 forward and reversely a preset number of times.

For example, a non-illustrated server (or memory) may store the number of reciprocating movements of the porous material that corresponds to the coating thickness. The control unit C may determine the number of reciprocating movements of the porous material depending on the information stored in the server (or memory).

During the process of depositing the atomic layer on the porous material, the control unit C may control the winding rollers 110 and 120 so that the porous material reciprocatingly moves by a preset distance in the longitudinal direction between the winding rollers 110 and 120.

Specifically, when the control instruction (e.g., the coating thickness) is inputted through the input unit 400, the winding rollers 110 and 120 may operate to initiate the reciprocating movement of the porous material 10, and the source substance supply units 210 and 220 may continuously (consistently) supply the source substances.

In this case, the control unit C may set a point in time at which the number of reciprocating movements of the porous material 10 is initially counted to a point in time at which the source substances begin to be supplied through the source substance supply units 210 and 220.

When the reciprocating movements are completed by the number of reciprocating movements of the porous material 10, the control unit C may control the winding rollers 110 and 120 to move the porous material 10 in the forward direction (i.e., the right direction in FIG. 1) by a distance corresponding to the current processing target part of the porous material 10 so that the coating process is performed on the next processing target part of the porous material 10.

The control unit C may stop the operations of the source substance supply units 210 and 220 when the current processing target part of the porous material 10 moves in the forward direction (i.e., the right direction in FIG. 1) and continuously operate the pumps 310 and 320.

In this case, as described above, the current processing target part of the porous material 10 may be a part corresponding to the length "L" of the porous material 10 that reciprocatingly moves below the source substance supply units 210 and 220. In addition, a length of the next processing target part of the porous material 10 may be equal to the length "L".

As described above, the coating process, which is performed simultaneously with the reciprocating movement by the length "L" of the porous material 10, and the forward movement by the length "L" of the porous material 10 may be repeated, and as a result, the coating process may be performed over the overall length of the porous material 10.

In addition, the control unit C may control and continuously (consistently) operate the pumps 310 and 320, and the operations of the pumps 310 and 320 may be initiated simultaneously with the operations of the source substance supply units 210 and 220 or before the operations of the source substance supply units 210 and 220.

However, to smoothly perform the coating process on the porous material 10 under a normal-pressure environment, the operations of the pumps 310 and 320 may be initiated before the operations of the source substance supply units 210 and 220.

Meanwhile, if there is an available space, a plurality of source substance supply units provided in the form of modules may be disposed in parallel. In this case, the longer length of the porous material 10 may be coated at a time.

Hereinafter, another embodiment of the present disclosure in which the plurality of source substance supply units in the form of modules is disposed in parallel will be described with reference to another drawing.

Figure 3:
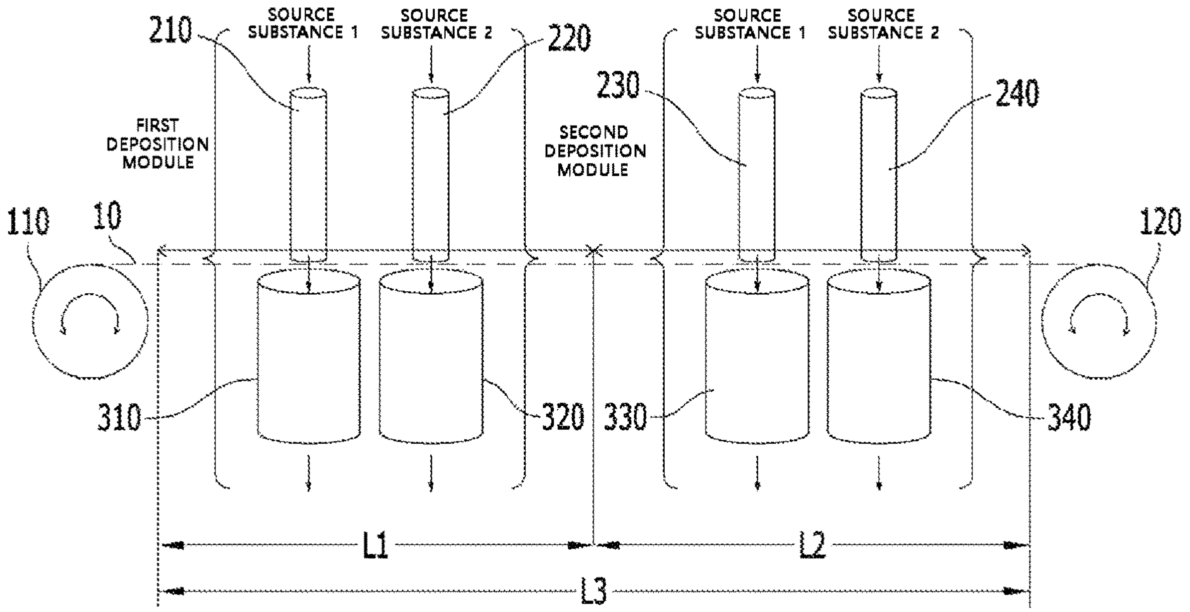
FIG. 3 is a conceptual view illustrating a roll to roll atomic layer deposition apparatus according to another embodiment of the present disclosure.

FIG. 3 is a conceptual view illustrating a roll to roll atomic layer deposition apparatus according to another embodiment of the present disclosure. Hereinafter, for convenience, the description of the contents described with reference to FIGS. 1 and 2 will be omitted or minimized, and the description will be made focusing on the parts different from those in the embodiment illustrated in FIG. 1.

The roll to roll atomic layer deposition apparatus according to the present embodiment differs from that in the embodiment illustrated in FIG. 1 in that the source substance supply unit in the form of a module is provided in plural, and the plurality of source substance supply units is disposed in parallel in the longitudinal direction (extension direction) of the porous material. In addition, the present embodiment is identical to the embodiment illustrated in FIG. 1 in terms of the reciprocating movement of the porous material by the operations of the winding rollers and the configuration in which the source substance supply unit and the pump are disposed in a one-to-one manner.

In addition, FIG. 3 illustrates two modules (i.e., two sets) of source substance supply units. However, three or more source substance supply units may be disposed in parallel.

Referring to FIG. 3, in the roll to roll atomic layer deposition apparatus according to the present embodiment, the source substance supply units 210 and 220 and the pumps 310 and 320 may be provided as a first deposition module, and the other source substance supply units 230 and 240 and the other pumps 330 and 340 may be provided as a second deposition module disposed in parallel with the first deposition module.

That is, the first deposition module and the second deposition module may be disposed in parallel in the extension direction of the porous material 10.

The first deposition module may include the first source substance supply unit 210, the second source substance supply unit 220, the first pump 310, and the second pump 320. The second deposition module may include the third source substance supply unit 230, the fourth source substance supply unit 240, the third pump 330, and the fourth pump 340.

The first deposition module and the second deposition module may be configured to be identical to each other and supply the same source substance.

Specifically, the first source substance supply unit 210 and the third source substance supply unit 230 may supply the same source substance 1. In addition, the second source substance supply unit 220 and the fourth source substance supply unit 240 may supply the same source substance 2.

In addition, the first pump 310 may be disposed to correspond to the first source substance supply unit 210, the second pump 320 may be disposed to correspond to the second source substance supply unit 220, the third pump 330 may be disposed to correspond to the third source substance supply unit 230, and the fourth pump 340 may be disposed to correspond to the fourth source substance supply unit 240.

Meanwhile, in the porous material 10 extending between the pair of winding rollers 110 and 120, a part corresponding to a first length "L1" may be coated by the first deposition module, and a part corresponding to a second length "L2" adjacent to the first length may be coated by the second deposition module.

That is, according to the present embodiment, a part corresponding to an overall length "L3 (=L1+L2)" of the porous material 10 between the pair of winding rollers 110 and 120 may be coated at a time. In this case, L1 and L2 may be equal to each other. This is to enable the coating process to be simultaneously performed on the L1 part corresponding to the first length of the porous material 10 and the L2 part corresponding to the second length in the case in which the distance of the reciprocating movement of the porous material 10 is constant.

Specifically, a right end of the L1 part corresponding to the first length of the porous material 10 adjoins a left end of the L2 part corresponding to the second length.

The L1 part may reciprocatingly move between a first position and a second position when a position at which the left end of the L1 part corresponds to the left end of the first deposition module (i.e., the left end of the first source substance supply unit 210) is defined as the first position and a position at which the right end of the L1 part corresponds to the right end of the first deposition module (i.e., the right end of the second source substance supply unit 220) is defined as the second position.

Likewise, the L2 part may also reciprocatingly move between the first position at which the left end of the L2 part corresponds to the left end of the second deposition module (i.e., the left end of the third source substance supply unit 230) and the second position at which the right end of the L2 part corresponds to the right end of the second deposition module (i.e., the right end of the fourth source substance supply unit 240).

That is, when the porous material 10 reciprocatingly moves, the porous material 10 may be positioned such that the left end of the L2 part corresponds to the left end of the second deposition module when the left end of the L1 part corresponds to the left end of the first deposition module. In addition, the porous material 10 may be positioned such that the right end of the L2 part corresponds to the right end of the second deposition module when the right end of the L1 part corresponds to the right end of the first deposition module.

Therefore, as the porous material 10 reciprocatingly moves in the state in which the source substances are supplied from the first to fourth source substance supply units 210, 220, 230, and 240, the entire L3 part corresponding to the processing target length of the porous material 10 may be coated.

Even in this case, as described above, the first to fourth pumps 310, 320, 330, and 340 may consistently operate at the same time when the source substances are supplied from the first to fourth source substance supply units 210, 220, 230, and 240 (particularly, before the source sub stances are supplied).

In addition, after the porous material 10 reciprocatingly moves the preset number of reciprocating movements determined depending on the coating thickness, the supply of the source substance is stopped, and the porous material 10 may move in the forward direction (to the right in the drawings) by the length L3 corresponding to the overall length subjected to the processing and then be wound around the second winding roller 120. Further, the coating process may be performed in the same manner on the next processing target part of the porous material 10 supplied by being unwound from the first winding roller 110.

Therefore, the coating process may be smoothly and uniformly performed on the porous material 10 without a vacuum chamber. The coating process may be completely performed on the porous material 10 for a relatively short time because a process such as a purge process is not separately needed.

Hereinafter, a method of controlling the roll to roll atomic layer deposition apparatus according to the present disclosure will be described with reference to another drawing.

Figure 4:
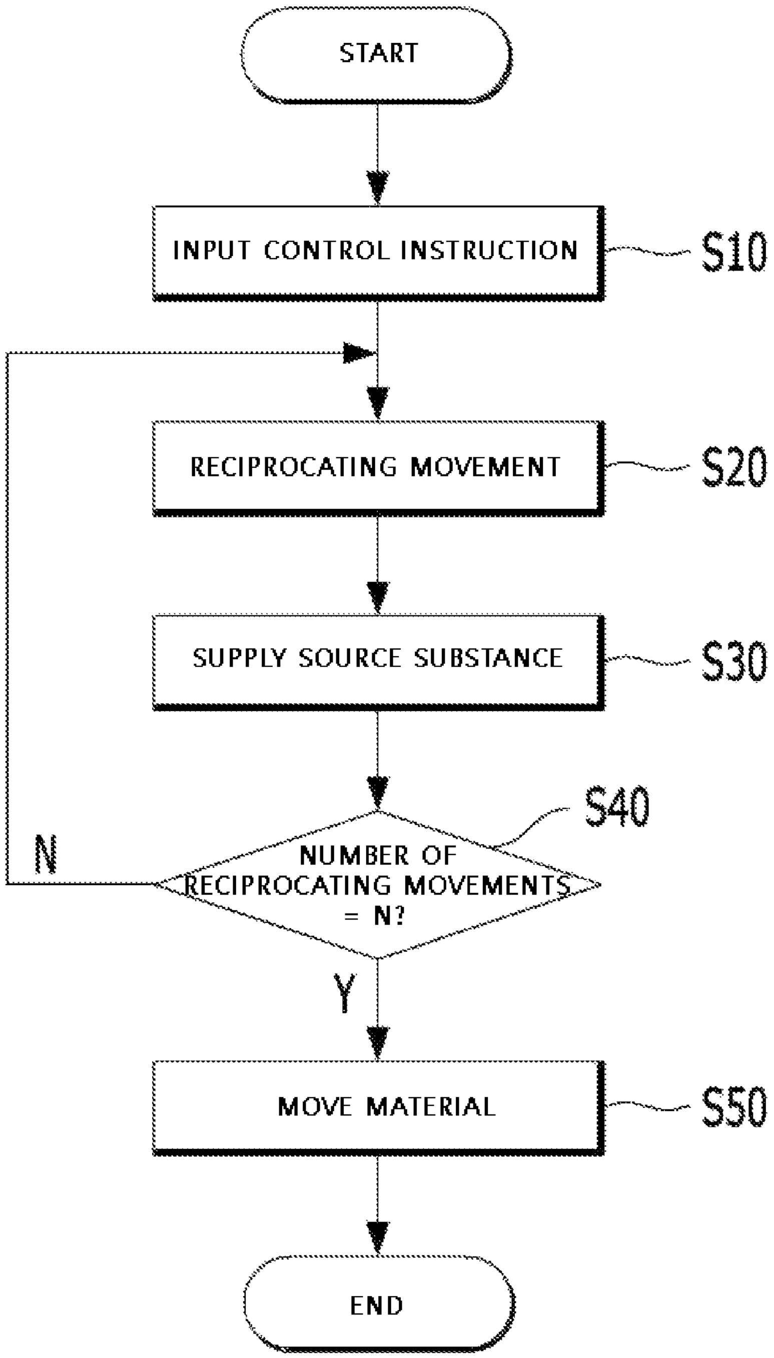
FIG. 4 is a view illustrating a method of controlling the roll to roll atomic layer deposition apparatus according to the present disclosure.

FIG. 4 is a view illustrating a method of controlling the roll to roll atomic layer deposition apparatus according to the present disclosure. It is apparent that the control configuration described with reference to FIG. 2 may be equally applied to the present control method, and the present control method may be applied to control the roll to roll atomic layer deposition apparatus.

Referring to FIG. 4, the method of controlling the roll to roll atomic layer deposition apparatus according to the present disclosure may include a control instruction input step S10, a reciprocating movement step S20, a source substance supply step S30, a reciprocating movement number determination step S40, and a material movement step S50.

In the control instruction input step S10, a user's control instruction may be inputted through the input unit 400. In this case, the control instruction may include at least one of types of source substances, thicknesses of coatings to be deposited on the porous material, and the number of reciprocating movements of the porous material.

In the reciprocating movement step S20, the porous material may reciprocatingly move in the longitudinal direction (horizontal direction) by a preset reciprocating movement distance depending on the control instruction inputted in the control instruction input step S10.

In the source substance supply step S30, the source substance may be supplied to the porous material from at least one of the first to fourth source substance supply units in the state in which the porous material reciprocatingly moves continuously.

In the reciprocating movement number determination step S40, the number of reciprocating movements of the porous material in the longitudinal direction may be determined. Specifically, the number of reciprocating movements of the porous material is determined depending on the control instruction (i.e., the coating thickness) inputted in the control instruction input step S10. Further, in the reciprocating movement number determination step S40, whether the number of reciprocating movements of the porous material in the longitudinal direction reaches the predetermined number of reciprocating movements may be determined.

Meanwhile, the source substance begins to be supplied after the reciprocating movement of the porous material is initiated. Therefore, to implement a more accurate coating thickness, a point in time at which the number of reciprocating movements is initially counted in the reciprocating movement number determination step S40 may be a point in time at which the source substance begins to be supplied.

When it is determined in the reciprocating movement number determination step S40 that the number of reciprocating movements of the porous material reaches the predetermined number of reciprocating movements, the process goes to the material movement step S50.

In the material movement step S50, the porous material may move in the forward direction by the distance of the reciprocating movement performed in the reciprocating movement step S20 and then be wound around the winding roller at one side.

Further, the above-mentioned process may be repeatedly performed on a non-processed porous material supplied from the winding roller at the other side.

The exemplary embodiments of the present disclosure described above may be various modified, changed, and altered within the spirit and scope of the present disclosure by those skilled in the art to which the present disclosure pertains, and the modifications, changes, and alterations belong to the appended claims.

What is claimed is:

1. A method for a roll to roll atomic layer deposition, the method comprising:

moving, by a pair of winding rollers, reciprocatingly a porous material by a preset distance in a longitudinal direction between the pair of winding rollers;

supplying continuously, by one or more source substance supply units, a source substance to the porous material while the porous material is moving reciprocatingly in the longitudinal direction; and controlling one or more pumps to continuously perform a sucking operation to suck the source substance supplied from the one or more source substance supply units, and controlling the one or more pumps such that all of the one or more pumps initiate the sucking operation before all of the one or more source substance supply units initiate supplying continuously the source substance to the porous material, wherein:

the pair of winding rollers is disposed to be spaced apart from each other and winds two opposite side portions of the porous material in the longitudinal direction, the one or more source substance supply units are disposed between the pair of winding rollers;

the one or more pumps are disposed to correspond to the one or more source substance supply units in a one-to-one manner;

the one or more source substance supply units, the porous material and the one or more pumps are arranged without a vacuum chamber;

the one or more source substance supply units and the one or more pumps are disposed, respectively, to face one another with the porous material interposed therebetween, such that the source substance supplied from the one or more source substance supply units is introduced directly into the one or more pumps after passing through the porous material for immediate discharge by the one or more pumps and without the vacuum chamber, no inert gas is utilized for the source substance to be introduced directly into the one or more pumps after passing through the porous material, and a suction port of one of the one or more pumps is disposed to face a supply port disposed at an end of one of the one or more source substance supply units, a diameter of the suction port is larger than a diameter of the supply port, and a radial center of the supply port and a radial center of the suction port are positioned on a same vertical line penetrating the porous material.

2. The method of claim 1, wherein the one or more source substance supply units include a plurality of source substance supply units, the one or more pumps include a plurality of pumps, and the supply ports of the plurality of source substance supply units and the suction ports of the plurality of pumps correspond to one another in the one-to-one manner.

3. The method of claim 1, wherein the one or more source substance supply units and the one or more pumps are controlled to be continuously operated without a purge process.

4. The method of claim 1, wherein a radius of the suction port is 1.2 to 3 times of a radius of the supply port.

5. A method for a roll to roll atomic layer deposition, the method comprising:

moving, by a pair of winding rollers, reciprocatingly a porous material by a preset distance in a longitudinal direction between the pair of winding rollers;

supplying continuously, by one or more source substance supply units, a source substance to the porous material while the porous material is moving reciprocatingly in the longitudinal direction; and controlling one or more pumps to continuously perform a sucking operation to suck the source substance supplied from the one or more source substance supply units, and controlling the one or more pumps such that all of the one or more pumps initiate the sucking operation before all of the one or more source supply units initiate supplying continuously the source substance to the porous material, wherein:

the one or more source substance supply units are disposed between the pair of winding rollers;

the one or more pumps are disposed to correspond to the one or more source substance supply units in a one-to-one manner;

the one or more source substance supply units, the porous material and the one or more pumps are arranged without a vacuum chamber;

the one or more source substance supply units and the one or more pumps are disposed, respectively, to face one another with the porous material interposed therebetween, such that the source substance supplied from the one or more source substance supply units is introduced directly into the one or more pumps after passing through the porous material for immediate discharge by the one or more pumps and without the vacuum chamber, no inert gas is utilized for the source substance to be introduced directly into the one or more pumps after passing through the porous material, and a suction port of one of the one or more pumps is disposed to face a supply port disposed at an end of one of the one or more source substance supply units, a diameter of the suction port is larger than a diameter of the supply port, and a radial center of the supply port and a radial center of the suction port are positioned on a same vertical line penetrating the porous material.

6. The method of claim 5, the supply ports of the one or more source substance supply units and the suction ports of the one or more pumps correspond to one another in the one-to-one manner.

* * * * *